United States Patent [19]

Currie et al.

[11] Patent Number: 4,573,155
[45] Date of Patent: Feb. 25, 1986

[54] MAXIMUM LIKELIHOOD SEQUENCE DECODER FOR LINEAR CYCLIC CODES

[75] Inventors: Robert J. Currie, Salt Lake City; Billie M. Spencer, Bountiful; John W. Zscheile, Jr., Farmington; Glen D. Rattlingourd, Salt Lake City, all of Utah

[73] Assignee: Sperry Corporation, New York, N.Y.

[21] Appl. No.: 561,502

[22] Filed: Dec. 14, 1983

[51] Int. Cl.⁴ .............................................. G06F 11/10
[52] U.S. Cl. ....................................................... 371/37
[58] Field of Search .............................. 371/37, 39, 40

[56] References Cited

U.S. PATENT DOCUMENTS 3,818,442  6/1974  Solomon ................................. 371/37
4,328,582  5/1982  Battail et al. .......................... 371/37
4,382,300  5/1983  Gupta .................................... 371/37
4,462,101  7/1984  Yasuda et al. ......................... 371/43
4,493,080  1/1985  Campbell ............................... 371/37

Primary Examiner—Charles E. Atkinson
Attorney, Agent, or Firm—John B. Sowell; Thomas J. Scott; Marshall M. Truex

[57] ABSTRACT

A novel maximum likelihood sequence detector is provided for decoding linear cyclic error correction codes. The detector comprises one cyclic correlator for each two shaft sets of the code which have weights greater than one, and a serial correlator for detecting the shift sets of all zero's and all one's. The number of cyclic correlators required to decode linear codes is reduced to less than half the number of shift sets which define all the codewords instead of half the number of codewords where the number of shift sets is always less than the number of codewords.

10 Claims, 4 Drawing Figures

MAXIMUM LIKELIHOOD SEQUENCE DECODER FOR LINEAR CYCLIC CODES

BACKGROUND OF THE INVENTION

1. Field of the Invention

The present invention relates to a maximum likelihood sequence detector for decoding linear cyclic error correction codes. More particularly, the present invention decoder is adapted to decode linear cyclic error correction codes employing cyclic correlators instead of matched filters.

2. Description of the Prior Art

Matched filter decoders have been designed to match the signal that is being decoded. When a very large number of codewords are employed in a code set, it has been necessary to provide a matched filter for each of the codewords in the code set. It is known that the number of matched filters in a decoder can be reduced by a factor of two by using the complementary property of the code.

Serial correlators are known and commercially available. Such commercially available serial correlators will continuously examine a bit stream and compare it with a reference bit stream. The comparison value or the score is accumulated over a time period which is usually one word time. When a complete code set of codewords are being decoded employing serial correlators, it has been necessary to provide half the number of serial correlators as there are codewords in the code set similar to the aforementioned matched filters.

It is often desirable to employ a code set having a large number of codewords. However, the amount of hardware necessary to decode a large number of codewords may become a limiting factor in the choice of the set of codewords. Heretofore, known decoders have not employed less than half the number of matched filters or serial correlators as there are codewords in a code set to decode linear cyclic codes.

It would be desirable to provide a new and efficient decoder for decoding linear cyclic codes which is simpler and more efficient than decoders known in the prior art.

SUMMARY OF THE INVENTION

It is a principal object of the present invention to provide a novel decoder for decoding linear cyclic codes.

It is another principal object of the present invention to provide a novel cyclic correlation decoder.

It is another object of the present invention to provide a novel cyclic correlation decoder having a plurality of cyclic correlators.

It is another object of the present invention to provide a novel cyclic correlation decoder having less than half the number of cyclic correlators as there are codewords in a code set.

It is another principal object of the present invention to provide a novel cyclic correlation decoder having one cyclic correlator for each pair of complementary shift sets.

It is a general object of the present invention to provide a novel maximum likelihood sequence detector for decoding linear cyclic codes.

DESCRIPTION OF THE PREFERRED EMBODIMENT

Figure 1:
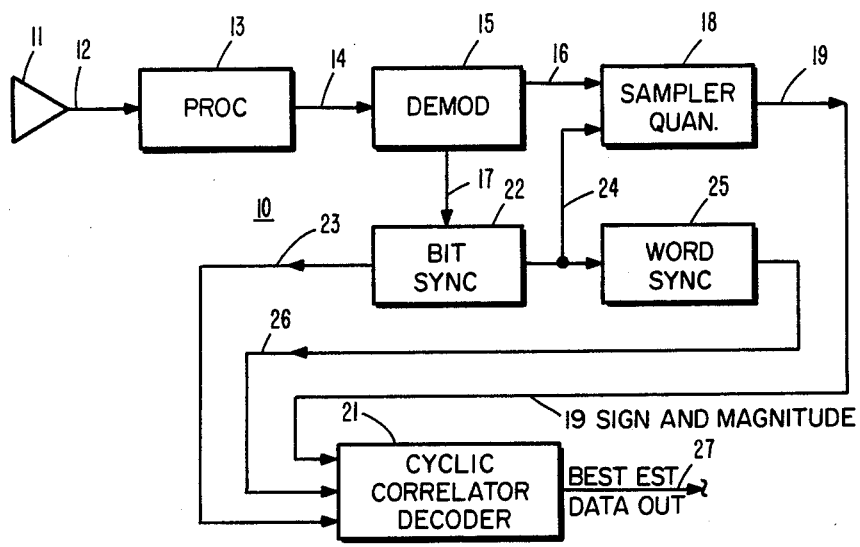
FIG. 1 is a simplified logic block diagram circuit showing a receiver for receiving an encoded data signal comprising linear cyclic error correction codewords.

Receiving and demodulating means 10 comprises an antenna 11 which receives a coded signal which is applied via line 12 to the signal shaping and processing means 13 to provide amplified shaped signals on line 14. The received and processed signal on line 14 is demodulated by demodulator 15 to provide an output signal on lines 16 and 17. The demodulated signal on line 16 is applied to sampler quantizer 18 which converts the signal into digital form on output line 19. The digitized signal on line 19 is applied to the cyclic correlator decoder 21. The demodulated signal on line 17 is applied to a bit synchronizer 22 which produces a clock signal or bit synchronized signal on line 23. The bit synchronized signal on line 24 serves as a clock input to sampler quantizer 18 and also a clock to the word synchronizer 25. The output of word synchronizer 25 on line 26 is applied to the cyclic correlator decoder along with the bit sync or clock on line 23. The signal on output line 19 contains both the sign and magnitude of the data signal being received at antenna 11. As will be explained hereinafter, the cyclic correlator decoder is capable of producing a best estimate of the data on output line 27 and the cyclic correlator decoder 21 produces a maximum likelihood decision of the estimate of the data on line 19 which is processed in decoder 21.

Before explaining the present invention novel cyclic correlator decoder, it should be understood that decoder 21 is operating as a maximum likelihood decoder and maximum likelihood decoders were known in the prior art. Such prior art decoders have heretofore employed serial correlators or matched filters, however, as will be explained hereinafter a larger number of such prior art devices were required than are required in the novel cyclic correlator decoder.

Figure 2:
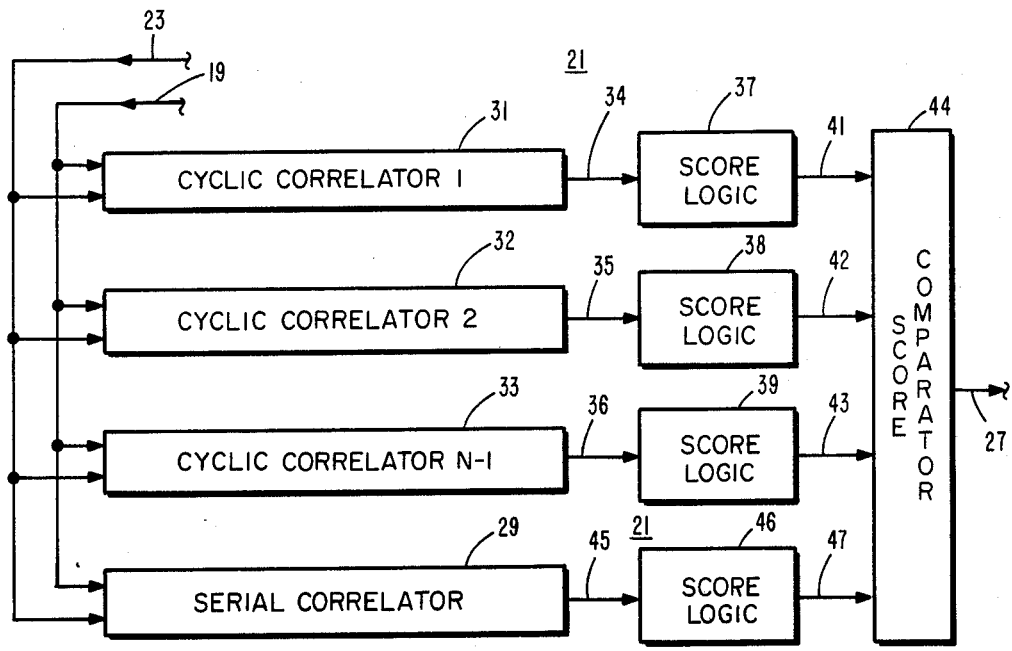
FIG. 2 is a logic block diagram circuit showing the functional elements of the cyclic correlation decoder of FIG. 1.

Refer now to FIG. 2 showing line 19 from the sampler quantizer and the clock bit line 23 applied to a plurality of cyclic correlators 31, 32 and 33 and to serial correlator 29. Cyclic correlators 31 to 33 basically compare a plurality of known codewords with the incoming signal on line 19 and produce a score or correlation factor for each of the codewords as an output on line 34, 35 and 36. The scores or correlation factors presented on lines 34 to 36 are examined by score logic 37, 38 and 39 and the largest score for any of the codewords is stored in registers of the score logic 37, 38 and 39 respectively. In addition to storing the largest score, the score logic 37, 38 and 39 also stores the identity of the codeword associated with the largest score. The information stored in score logic 37, 38 and 39 is presented on lines 41, 42 and 43 to a score comparator 44. The largest score associated with any of the score logics is now selected as being the score associated with the codeword which is the codeword most likely transmitted and processed by system 10. The data representative of this codeword is now presented on output line 27 for further processing or use. Serial correlator 29 is provided for the specific purpose of detecting all zeroes or all ones. The output of serial correlator 29 on line 45 is applied to a score logic 46 to provide an output on line 47 indicative of whether zeroes or ones are being received.

Figure 4:
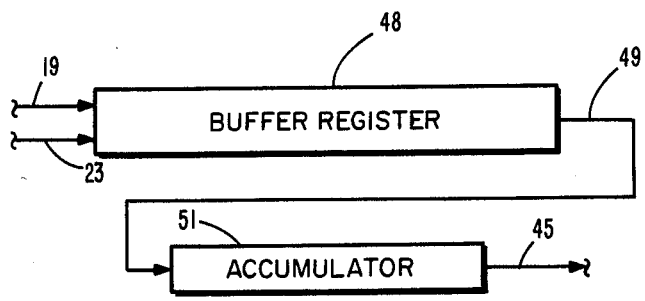
FIG. 4 is a logic block diagram of a simplified serial correlator of the type shown in FIG. 2.

Refer now to FIG. 4 showing in greater detail a simplified serial correlator 29. The received information on line 23 is applied to buffer register 48 in a manner similar to that explained hereinbefore with regards to cyclic correlators 31 to 33. Buffer register 48 provides means for synchronizing the codewords passing through serial correlator 29 with the information being processed through cyclic correlators 31 to 33. The output of buffer register 48 on line 49 is a delayed version of the received information on line 23. The information on line 49 is passed through accumulator 51 which adds up and accumulates the value of the soft decision of the bits of the received word to provide a score and index value of the codeword associated with the score on line 45 to score logic 46. The information being presented on line 47 to score comparator 44 is capable of identifying the all zero or all one codeword. It will be understood that the simplified logic block diagram shown in FIG. 4 may be altered by eliminating the buffer register 48. The information on lines 19 and 23 may be applied directly to an accumulator and the score and index information can be presented on line 45 to score logic 46. By reading out the score logic information and index information from score logic 46 at a delayed or desired time, the functional requirement for the delay or buffer register 48 may be dispensed with. The score logic 46 will provide the function of a buffer register in addition to the aforementioned functions of storing the score and index values.

Figure 3:
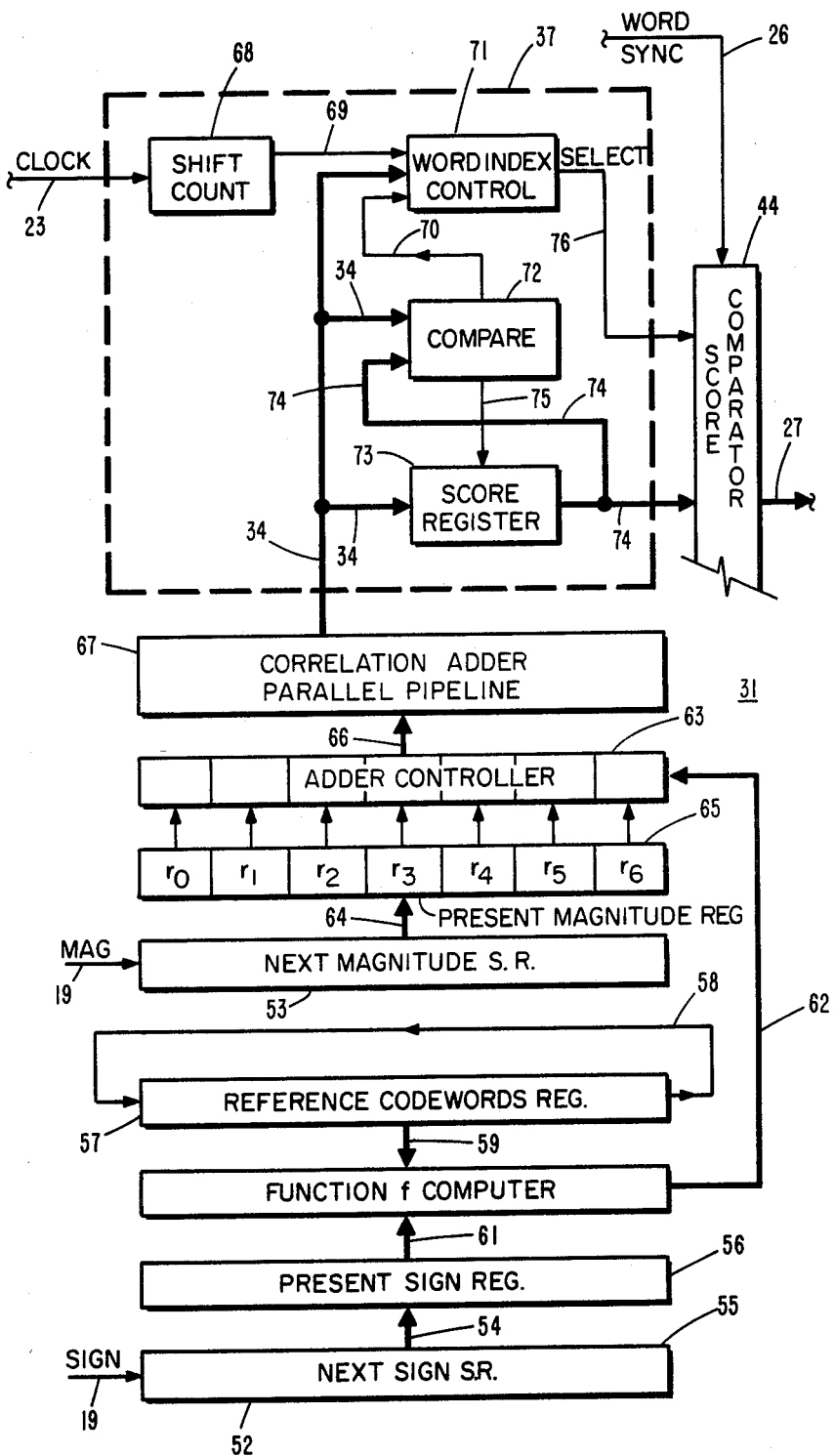
FIG. 3 is a detailed logic block diagram circuit showing a preferred embodiment cyclic correlator.

Refer now to FIG. 3 showing a block diagram in more detail of one of the cyclic correlators such as correlator 31. The information from sampler quantizer 18 on line 19 is presented to the sign and magnitude shift registers 52 and 53. The serial stream of information is shifted into register 52 and is read out in parallel on line 54 to the present sign register 55. The information in register 55 is examined by the function computer 56 to determine if the values in the magnitude registers are to be added or subtracted on a bit by bit basis as will be explained hereinafter. Any one of the selected codewords of the cyclic shift set is stored in reference codeword shift register 57 and is circulated end around via line 58. Shift register 57 comprises a plurality of flip-flops whose output is applied in parallel to function computer 56 via line 59. The information in sign register 55 is also applied in parallel via line 61 to function computer 56. It will be understood that the lines or bus 62 are presenting the information from function computer 56 in parallel form to the bit or cell positions of adder control 63. The received information on line 19 has been shifted into register 53 and is presented as a parallel output on lines 64 to the present magnitude register 65. Register 65 comprises a plurality of flip-flops employed to store the soft decision information being provided on line 64.

In the present invention, the correlation score of a codeword, as defined by the present position of the reference codeword in register 57, is the sum of the magnitudes (shown as $R_0$ to $R_6$ storage cells) in register 65 as conditioned by the function (f) generated by function computer 56. Function (f) is equal to "1" if the sign bit and the corresponding code bit are the same. If the sign bit and the corresponding code bit are not the same, then the function (f) is "−1". To compute the score of a particular codeword at any bit time, add the magnitudes of the received bits in register 65 when the sign in register 55 and the corresponding bit of the reference codeword in register 57 are the same. Subtract the magnitude of the received bits in register 65 when the sign in register 55 and the corresponding bit of the reference codeword in register 57 are different.

Thus, it will be understood that magnitudes are stored in register 65 which are employed to produce scores for each of the cyclic shift codewords stored in register 57 during each bit time. The adder controller 63 controls the information on output line 66 being applied to correlation adder 67. Correlation adder 67 is merely a parallel or pipeline adder so that the scores of each of the reference codeword during each bit time is being presented on line 34 to the score logic 37 shown inside phantom lines. It will be understood that a different score will be presented on line 34 for each of the shift positions of the referenced codeword register 57. The preferred mode of operation of the score logic 37 is to retain and store the highest score being presented to the score logic during one full cycle of the referenced codeword in register 57. The bit sync pulses on line 23 are applied as a clock to shift counter 68 which maintains a count of the shifting of the codeword in register 57. The count on line 69 is applied to word index control 71 which can identify the shift position of the codeword. During each shift position of the codeword, a new score is presented on lines 34 to comparator 72 along with the present score in score register 73 on line 74. The score being retained in register 73 is the highest score achieved during the word time cycle of register 57. The comparator 72 jams the highest score being compared into score register 73 via line 75, thus, the highest score is always available on line 74 to the score comparator 44. Only absolute values of magnitude are being compared in comparator 72 and the sign line 34 having the sign position of the score on line 34 is applied directly to word index control 71. When the sign of the value of the codeword presented to word index control 71 is negative, it indicates that the highest score achieved was for the corresponding word from the complementary shift set. Similarly, when the sign of the score presented to the word index control 71 is positive, then the word with the highest score is the word being indicated to be the word in the shift position of the codeword register 57. Line 70 from comparator informs word index control 71 which codeword has achieved the highest score.

The word index control 71 takes the shift count from the register 68, the sign from the correlation adder on line 34 and the codeword in its shift set and its complement which is the codeword that achieved the highest score and indicates this on select line 76. It will be understood that the score comparator 44 has a score input 74 and a select line input 76 from each of its associated cyclic correlators 31, 32 and 33 as well as from serial correlator 29. Score comparator 44 operates in a manner similar to score logic 37 and determines which of the scores being presented by the cyclic correlators is the highest score and identifies the associated codeword to provide an output on line 27.

Having explained the operation of a cyclic correlator without reference to any particular code, it will be understood that the cyclic correlator described in FIGS. 1 to 3 are capable of decoding any linear cyclic code or any code based on a linear code. The code space of any error correcting code with k information bits and n length can be considered an M-ary signal space with $M=2^k$. Decoding of such error correcting codes can be accomplished by correlation detection. In general, decoding would require $2^k$ correlators. Employing the present invention linear cyclic codes, the number of correlators required by using both the cyclical and symmetry properties of the codes will permit a reduction of the number of correlators to half the number of cyclic shift sets. This value is approximately equal to $(2^{k-1}-1)/n$. For purposes of this invention, a cyclic shift set may be defined as the set of words formed by cyclic shifts of any one of the words. Every shift of a codeword as described hereinbefore with reference to register 57 is another codeword, and the complement of every codeword is a codeword. This will allow the use of only half as many correlators as the number of cyclic shift sets which further reduces the number of correlators required. As an example of how the number of correlators may be reduced for a particular linear code, we may employ a Hamming (7,4) code as follows:

| | |
|---|---|
| 0000 | 000 |
| 0001 | 011 |
| 0010 | 110 |
| 0011 | 101 |
| 0100 | 111 |
| 0101 | 100 |
| 0110 | 001 |
| 0111 | 010 |
| 1000 | 101 |
| 1001 | 110 |
| 1010 | 011 |
| 1011 | 000 |
| 1100 | 010 |
| 1101 | 001 |
| 1110 | 100 |
| 1111 | 111 |

An examination of the above Hamming (7,4) code reveals that the code has $2^4$ or sixteen codewords. Further examination reveals that the weight structure of the codewords is as follows:

| | Cyclic Shift Sets | | | |
|---|---|---|---|---|
| With Weight | 0 | 3 | 4 | 7 |
| Number of words | 1 | 7 | 7 | 1 |

All sixteen codewords fall into four shifts set having the weights zero, three, four and seven, thus, there are four cyclic shift sets of which two are decodable as all 1's or all 0's. It will be noted that the word of zero weight is the complement of the word of weight seven and that the words of weight three have complements in the shift sets of weight four. In the most common prior art decoders, sixteen serial correlators would be employed to decode the sixteen codewords and in a modified or improved prior art decoder, eight serial decoders could be employed taking advantage of the complement of half of the codewords.

Since there are only four shift sets in the above-described Hamming code, the present invention novel decoder can employ only one cyclical correlator and one serial correlator to decode the sixteen codewords.

Employing any one of the codewords of the above codeword set having a weight structure of three (ie, three 1's), it can be shown that the complete set of sixteen codewords can can be generated by end-around shifting as explained hereinbefore with regards to register 57. The table which follows shows that all of the weight three codewords are generated as codewords by shifting to the seven indicated shift positions. Similarly, all of the weight four codewords are generated as complements of the weight three codeword in the corresponding shift position. The codeword having all ones or all zeroes is decoded by an accumulator or serial correlator as described hereinbefore.

| SHIFT POSITION | CODEWORD | | COMPLEMENT | CODEWORD |
|---|---|---|---|---|
| 0 | 0001 | 011 | 1110 | 100 |
| 1 | 0010 | 110 | 1101 | 001 |
| 2 | 0101 | 100 | 1010 | 011 |
| 3 | 1011 | 000 | 0100 | 111 |
| 4 | 0110 | 001 | 1001 | 110 |
| 5 | 1100 | 010 | 0011 | 101 |
| 6 | 1000 | 101 | 0111 | 010 |

The above table clearly indicates that one cyclic correlator and one serial correlator is capable of generating all sixteen codewords in the above-described Hamming (7,4) code. Thus, the number of correlators employed in the present invention are reduced from a prior art requirement of eight to only two.

As a further example of how the number of matched filters or prior art correlators may be reduced, several examples will be given.

When a Golay (23, 12) code is employed, as many as 4096 matched filters or serial correlators were required using the prior art method. When the complementary group of the codewords are eliminated, there are still 2048 prior art serial correlators or matched filters required to decode this code. Employing the present invention, it can be shown that the same end result function can be accomplished employing 89 cyclic correlators and one serial correlator to decode 180 cyclic shift sets. A substantial improvement is made by the present invention.

When a more complex code such as a Bose-Chaudhuri-Hocquenghem code, known as BCH (31, 11) code is employed, the optimum number of prior art matched filters or serial correlators required would be 1024. The present invention accomplishes the same end result with only 33 cyclic correlators and one serial correlator.

Having explained the present invention cyclic correlation decoder which achieves substantial improvement results over prior art decoders, it will be understood that other forms of cyclic correlation decoders may now be employed with other linear or cyclic codes. Codes that can be derived by extending, shortening or rearrangement of linear cyclic codes can also be decoded by the novel cyclic correlator decoder of the present invention. However, slight modifications may have to be made to the correlator of FIG. 3 to obtain the proper absolute value score of each of the codewords in the code set.

Even with modified linear codes, the number of correlators is only half the number of shift sets which define all the codewords. One of these correlators is in effect a serial correlator employed to detect all ones or zeroes and can be implemented by an accumulator as explained hereinbefore.

We claim:

1. A maximum likelihood sequence detector for decoding linear cyclic error correction codes, comprising:
   means for receiving and demodulating an encoded data signal comprising linear cyclic error correction codewords having $2^k$ codewords in a code set,
   means for quantizing said demodulated signals to provide a stream of quantized bits of information,
   said quantized bits of information comprising said codewords having a length n,
   a cyclic correlation decoder coupled to said stream of quantized bits comprising a plurality of cyclic correlators, and
   said number of cyclic correlators in said cyclic correlation decoder being less than the number of codewords in a code set by a factor greater than 2.

2. A maximum likelihood sequence detector as set forth in claim 1 wherein said cyclic correlation decoder further comprises one cyclic correlator for each pair of complementary shift sets.

3. A maximum likelihood sequence detector as set forth in claim 1 wherein each said cyclic correlator comprises a reference codeword register containing a codeword from a different shift set.

4. A maximum likelihood sequence detector as set forth in claim 1 wherein each said cyclic correlator further comprises a received data register for storing the magnitude of each of the quantized bits of information.

5. A maximum likelihood sequence detector as set forth in claim 4 which further includes an adder controller coupled to said received data register for determining whether to add or subtract the contents of said received data register.

6. A maximum likelihood sequence detector as set forth in claim 5 which further includes a parallel adder coupled to said adder controller for adding or subtracting the contents of said received data register.

7. A maximum likelihood sequence detector as set forth in claim 6 which further includes a score comparator coupled to the output of said parallel adder,
   a score register coupled to said score comparator, and
   said score comparator being adapted to compare the contents of said score register with the output of said parallel adder and for storing the largest value in said score register.

8. A maximum likelihood sequence detector as set forth in claim 7 which further includes comparator means coupled to said score comparators of said cyclic correlators for determining the cyclic correlator having the highest score in its score register, and
   a word index controller for indicating the codeword indicative of the cyclic correlator having the highest score.

9. A maximum likelihood sequence detector for decoding linear cyclic error correlation codes, comprising:
   means for receiving and demodulating an encoded data signal comprising linear cyclic error correction codewords having $2^k$ codewords in the code set,
   means for quantizing said demodulated signals to provide a stream of quantized bits of information,
   said quantized bits of information comprising said codewords having a length n,
   a cyclic correlation decoder coupled to said stream of quantized bits comprising a plurality of cyclic correlators, and
   said number of cyclic correlators in said cyclic correlation decoder being $(2^{k-1}-1)/n$ for producing a maximum likelihood decision output.

10. A maximum likelihood sequence detector for decoding linear cyclic error correction codes, comprising: means for receiving and demodulating an encoded data signal comprising linear cyclic error correction codewords having $2^k$ codewords in a code set,
    means for quantizing said demodulated signals to provide a stream of quantized bits of information,
    said quantized bits of information comprising said codewords having a length n,
    a cyclic correlation decoder coupled to said stream of quantized bits comprising a plurality of cyclic correlators and a serial accumulator detector of all the same state bits, and
    the number of said cyclic correlators in said cyclic correlation decoder being less than the number of codewords in a code set by a factor greater than 2.

* * * * *